(12) United States Patent
Dähn

(10) Patent No.: US 6,949,946 B1
(45) Date of Patent: Sep. 27, 2005

(54) INTEGRATED SEMICONDUCTOR CIRCUIT AND METHOD FOR FUNCTIONAL TESTING OF PAD CELLS

(75) Inventor: Wilfried Dähn, Celle (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/484,781

(22) Filed: Jan. 18, 2000

(30) Foreign Application Priority Data

Jan. 15, 1999 (DE) ................................ 199 01 460

(51) Int. Cl.$^7$ .......................................... H03K 19/00
(52) U.S. Cl. ............................ 326/16; 326/83; 326/57
(58) Field of Search ............................ 326/16, 82–86, 326/56–58

(56) References Cited

U.S. PATENT DOCUMENTS

| | | | |
|---|---|---|---|
| 4,490,673 A * | 12/1984 | Blum et al. ................ 324/73 R |
| 4,703,484 A | 10/1987 | Rolfe et al. | |
| 4,833,395 A * | 5/1989 | Sasaki et al. .............. 324/73 R |
| 4,973,904 A * | 11/1990 | Sonnek ......................... 326/16 |
| 5,471,153 A | 11/1995 | Martin | |
| 5,559,441 A | 9/1996 | Desroches | |
| 5,621,740 A | 4/1997 | Kamada | |
| 5,994,922 A * | 11/1999 | Aoki et al. .................... 326/16 |
| 6,199,182 B1 * | 3/2001 | Whetsel ........................ 326/16 |

FOREIGN PATENT DOCUMENTS

| | | |
|---|---|---|
| DE | 195 45 904 A1 | 6/1997 |
| EP | 0 745 859 A2 | 12/1996 |
| EP | 0 855 662 A1 | 7/1998 |
| JP | 5 312 857 | 11/1993 |
| JP | 10 078 474 | 3/1998 |
| JP | 10 325 854 A | 12/1998 |

* cited by examiner

*Primary Examiner*—Don Le
(74) *Attorney, Agent, or Firm*—Laurence A. Greenberg; Werner H. Stemer; Ralph E. Locher

(57) ABSTRACT

An integrated semiconductor circuit includes pad cells each having a connecting pad and an output driver. A transmission response of the pad cells is to be tested in a test mode. A signal transmitter is provided in order to produce periodic signal sequences. A periodic output signal from the signal transmitter is supplied as an input signal to an input of a pad cell to be tested. Through the use of an appropriate periodic signal at an output of the pad cell, the transmission response of the pad cell is tested in a frequency domain using a measurement method which employs a spectrum analyzer. This avoids complex measurements in the time domain, which have been carried out heretofore.

8 Claims, 2 Drawing Sheets

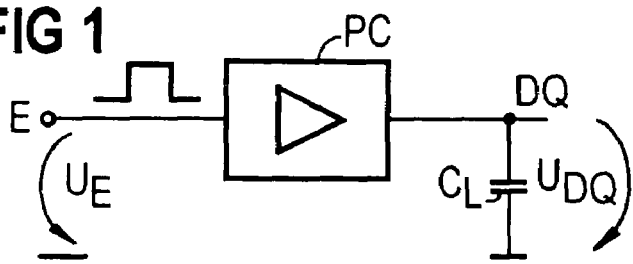
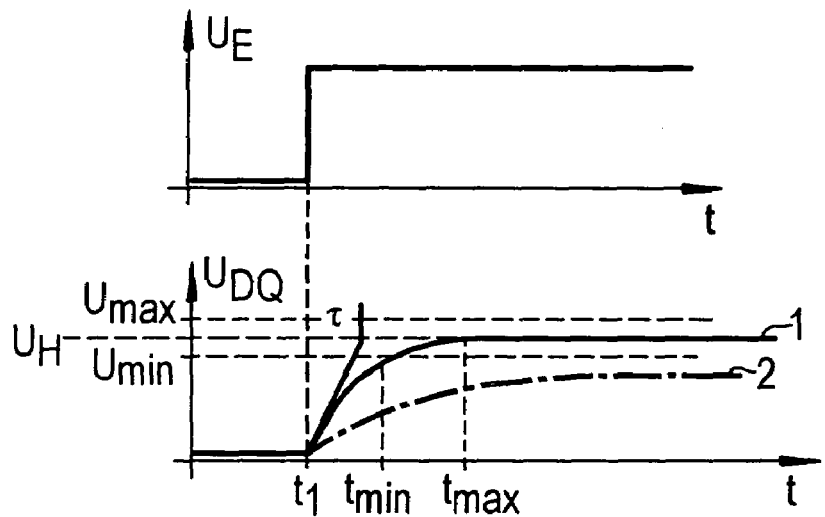
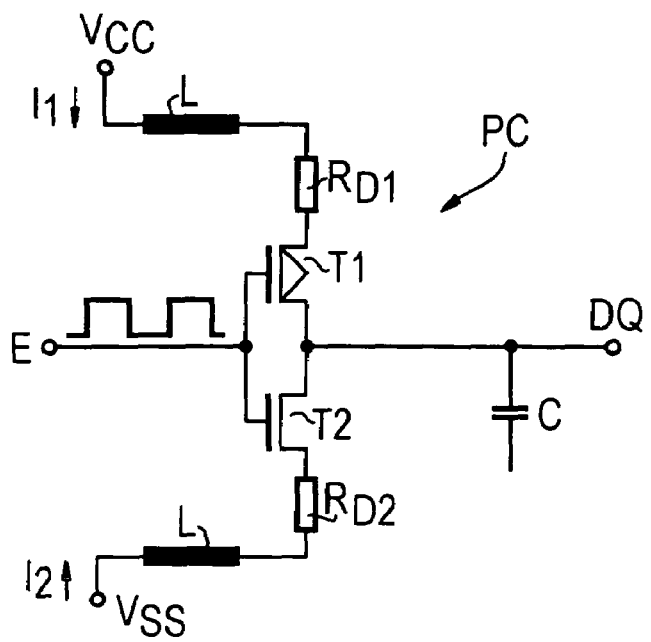

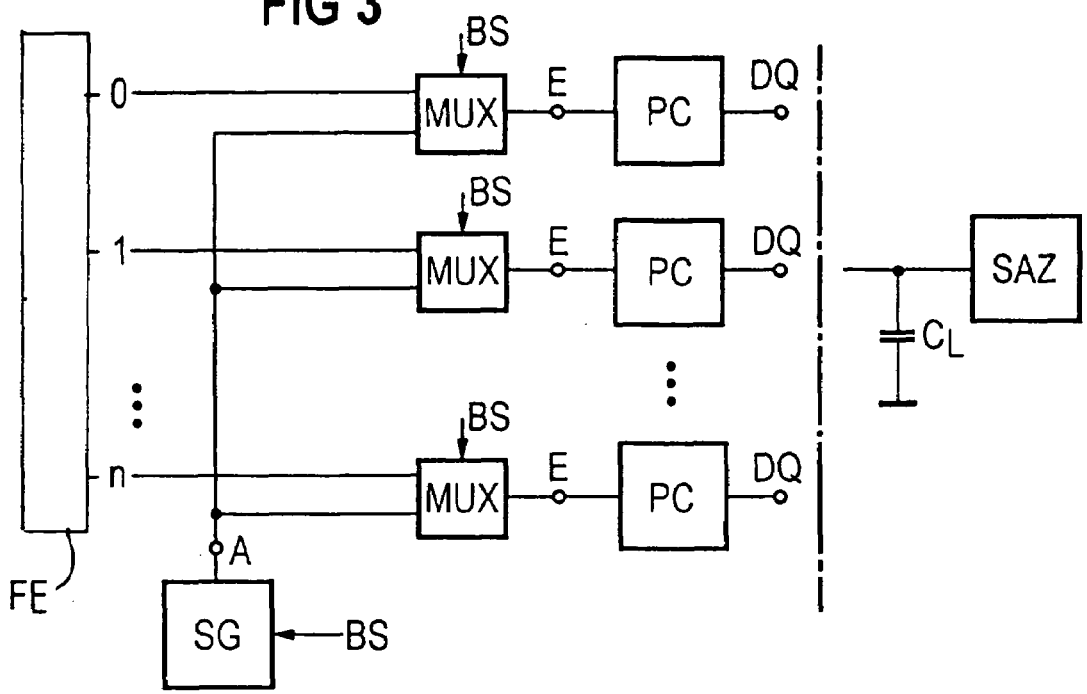
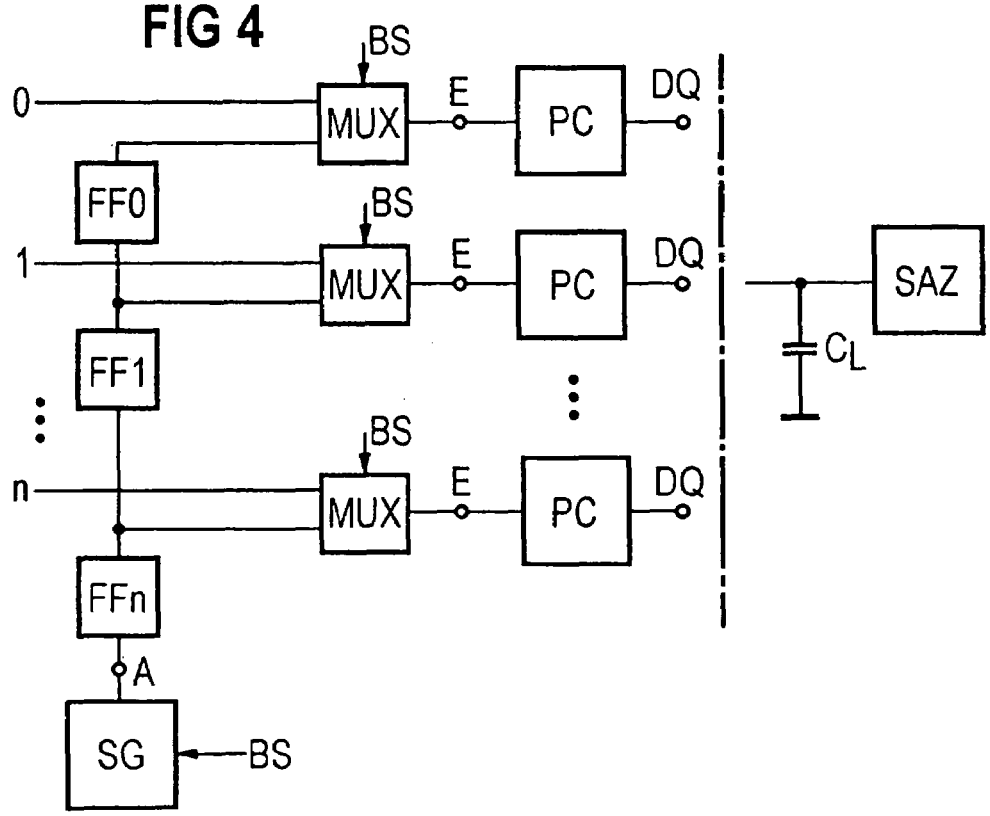

INTEGRATED SEMICONDUCTOR CIRCUIT AND METHOD FOR FUNCTIONAL TESTING OF PAD CELLS

BACKGROUND OF THE INVENTION

Field of the Invention

The invention relates to an integrated semiconductor circuit having pad cells, and to a method for functional testing of the pad cells.

Integrated semiconductor circuits have pad cells which include a connecting pad with a flat connecting area for external supply lines, and an upstream output driver. The external supply lines are used to interchange data or signals between different circuits or assemblies, and the output drivers which are integrated in the pad cells are used to output digital signals to the external supply lines. In order to provide reliable operation of the integrated circuit and of assemblies connected to the circuit, the serviceability of the output drivers must satisfy requirements which are specified in detail, particularly with regard to the transmission response for signals.

It is necessary to test the serviceability of the circuit, and thus of the individual pad cells, particularly in conjunction with the production of an integrated circuit. In order to do that, it is normal to take measurements to characterize the transmission response of the pad cells. The measurements provide information about the dynamic response of a pad cell to various types of signal excitation. Such signal excitations are, for example, step-function signal changes from a low signal level to a high signal level, or vice versa. The output signal response of the tested pad cell to step-function signal excitations is characterized by dynamic delays of signal transitions. During functional testing, the signal time response of the output of the pad cell is measured and is then investigated to determine whether or not that dynamic response of a pad cell is within specified tolerances. The measurements which are required for that purpose at precisely defined times must be carried out in that case at highly accurate times. The accuracy is located in the region of less than 100 ps (picoseconds) with the present state of development.

Those measurement accuracy requirements involve a high level of equipment complexity, and thus very complex and costly test facilities. However, the above-described stringent requirements for time accuracy of the test facilities are generally not required for other functional tests of integrated circuits.

SUMMARY OF THE INVENTION

It is accordingly an object of the invention to provide an integrated semiconductor circuit and a method for functional testing of pad cells, which overcome the hereinafore-mentioned disadvantages of the heretofore-known devices and methods of this general type and with which it is possible to carry out a functional test of a transmission response of the pad cells with a relatively low level of equipment measurement complexity.

With the foregoing and other objects in view there is provided, in accordance with the invention, an integrated semiconductor circuit, comprising at least one pad cell to be monitored in a first operating mode of the circuit by a functional test, the at least one pad cell each having a connecting pad, an upstream output driver and a connection for an input signal; and a signal transmitter for producing periodic signal sequences, the signal transmitter having a connection for a periodic output signal connected to the connection for an input signal of the at least pad cell to be tested, in order to test a transmission response of the at least one pad cell in the first operating mode. Application of a periodic signal to the pad cell allows a measurement to be carried out externally, in the frequency domain, at the output of the pad cell.

With the objects of the invention in view there is also provided a method for testing a transmission response of pad cells each including a connecting pad and an upstream output driver, in an integrated semiconductor circuit, which comprises connecting an output of a pad cell to be tested to a measurement input of a measurement configuration suitable for spectrum analysis; and measuring a transmission response of the pad cell in a frequency domain using the measurement configuration.

In this way, the dynamic response of the pad cell can be characterized. The requirements for the resolution of the measurement in the frequency domain and thus the equipment complexity of the measurement device can be kept low since, according to the invention, the detection of harmonics up to the fifth harmonic is adequate for sufficiently accurate analysis and the frequency separation between these harmonics is relatively large.

In accordance with another feature of the invention, the signal transmitter can be reprogrammed in order to produce different periodic signal sequences. It is thus possible to match the measurement to the characteristic of pad cells with different switching speeds. For example, that is done through the use of a signal sequence with a short period duration for relatively fast-switching output drivers, and a signal sequence with a longer period duration for relatively slow-switching out drivers.

In accordance with a further feature of the invention, if a plurality of pad cells have to be tested, the inputs of the pad cells to be tested can be connected in parallel to one or more connections for the output signal from the signal transmitter, or can be connected in series, for example through one shift register cell in each case, to a connection for the output signal from the signal transmitter. All of the pad cells to be tested thus receive the same input signal, that is delayed by one clock period in each case.

In accordance with a concomitant feature of the invention, in order to make it possible to switch over between the normal mode and the test mode as easily as possible, it is advantageous to connect a multiplexer circuit in each case between the input of the pad cell and the output from the signal transmitter. The multiplexer circuit is controlled, for example, by an operating mode controller.

Other features which are considered as characteristic for the invention are set forth in the appended claims.

Although the invention is illustrated and described herein as embodied in an integrated semiconductor circuit and a method for functional testing of pad cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 includes an upper part which is a schematic and block circuit diagram of a configuration for measuring a dynamic response of a pad cell, and a lower part which is a graph of an example of a profile of a step-function response of an output of the pad cell;

FIG. 2 is a schematic and block circuit diagram of an output driver of a pad cell, with model parameters; and FIGS. 3 and 4 are block circuit diagrams of exemplary embodiments of an integrated circuit according to the invention, having a plurality of pad cells to be tested.

DESCRIPTION OF THE PREFERRED EMBODIMENTS

Referring now to the figures of the drawings in detail and first, particularly, to FIG. 1 thereof, it is seen that an upper part of the figure shows a configuration for functional testing of a pad cell PC of an integrated circuit. This configuration is intended to be used to characterize a transmission response of an output driver of the pad cell PC in a test mode. To this end, a digital signal $U_E$ which is equivalent to a step-function from a low signal level to a high signal level is applied to an input E of the pad cell PC (connection for the input signal of the output driver). In addition, a signal profile of a signal $U_{DQ}$ of an output DQ of the pad cell PC is measured (connection for the supply line to be connected to the connecting pad). This signal profile characterizes a dynamic response of the pad cell PC, which can be simulated, with model parameters, by using an equivalent circuit. An example of a circuit diagram of an output driver of a pad cell PC with model parameters $R_{D1}$, $R_{D2}$, L, C is shown in FIG. 2.

A lower part of FIG. 1 shows a simplified profile of the so-called step-function response of the signal $U_{DQ}$ resulting from the step-function of the signal $U_E$. A voltage level of the signal $U_{DQ}$ in this case does not rise suddenly from a switch-on time $t_1$ to a value $U_H$ in the steady state, but correspondingly more slowly in a dynamic response corresponding to values of the model parameters $R_{D1}$, $R_{D2}$, L, C, characterized by a time constant t. As is generally known, its magnitude depends on the values of the model parameters $R_{D1}$, $R_{D2}$, L, C.

A criterion for serviceability of a pad cell PC in FIG. 1 is that the voltage level of the signal $U_{DQ}$ between a minimum time $t_{min}$ and a maximum time $t_{max}$ from the switch-on time $t_1$ has a value which is in a tolerance range between a minimum value $U_{min}$ and a maximum value $U_{max}$. A profile 1 of the signal $U_{DQ}$ shows an example of a step-function response of a serviceable pad cell PC. A profile 2 of the signal $U_{DQ}$ shows an example of the step-function response of a faulty pad cell PC. The time period between $t_{min}$ and $t_{max}$ with the present state of development is a few hundred picoseconds, which means that the measurement accuracy of the measurement apparatus is subject to comparatively stringent requirements. These requirements have the consequences that have already been mentioned initially, particularly with regard to high procurement costs.

FIG. 3 shows a circuit configuration having a single transmitter SG in order to produce periodic signal sequence. If the inputs E of the pad cells PC are stimulated with a periodic signal sequence, a periodic profile of the output signals $U_{DQ}$ can likewise be observed at their outputs DQ. That profile, depending on the characteristic of the input signal, is composed of a DC element, a fundamental frequency and harmonics. This profile can be measured by using a measurement method with a measurement configuration SAZ having a measurement input which is connected externally to the output DQ. The measurement configuration SAZ is suitable for carrying out a spectrum analysis, for example with a so-called spectrum analyzer, and can be characterized by an analysis of the recorded frequency spectrum.

Depending on the accuracy which is required for testing the transmission response, a more or less detailed equivalent circuit of the pad cell PC to be tested is produced with more or less different types of model parameters, depending on the level of detail. In the example shown in FIG. 2, the pad cell PC was characterized by model parameters $R_{D1}$, $R_{D2}$, L and C. Resistances $R_{D1}$ and $R_{D2}$ in this case model switched-on resistances of switching transistors T1 and T2, and inductance L models supply lines inductances, and a capacitance C models line capacitances. In an evaluation carried out after the measurement, the values of the previously defined model parameters for the pad cell PC are determined successively in a known manner (for example through the use of a Fourier analysis) from the frequency spectrum, which includes the amplitude response and/or the phase response. Those values are used to calculate the step-function response of the pad cell PC, which provides information as to whether or not the criterion for serviceability is satisfied. In this context, it is also possible to ascertain the step-function response by using the known analysis method directly from the frequency spectrum, without having to produce an equivalent circuit with model parameters beforehand.

The number of harmonics to be determined in the frequency spectrum is governed essentially by the number of model parameters being defined. The greater the number of model parameters that must be defined, the greater the number of harmonics to be detected. These are detected in rising sequence starting with the fundamental, and the amplitude response and/or phase response are/is recorded. It is known from experience that determination up to the fifth harmonic is sufficient for adequate accuracy. Since these are the only harmonics which are detected, and their frequency separation is relatively large in comparison with the harmonics above the fifth harmonic, the complexity of the measurement apparatus with regard to frequency selectivity remains relatively low. Consequently, it is considerably less than for a described measurement in the time domain. The step-function response is calculated through the use of the time constant t, which is calculated by using the values of the model parameters.

In the case of relatively slow-switching pad cells PC, the line inductance L as well as a load capacitance $C_L$ and the line capacitance C can be ignored in comparison with the switched-on resistance $R_{D1}$, $R_{D2}$ of the transistors T1 and T2. The measurement in the frequency domain can therefore be replaced by a simple direct-current measurement at the output DQ. Values of supply voltages $V_{CC}$ and $V_{SS}$ and currents $I_1$ and $I_2$ allow the respective resistances $R_{D1}$ and $R_{D2}$ to be calculated and thus, as mentioned above, the step-function response of the signal $U_{DQ}$. However, in order to carry out this measurement, it is necessary to increase the period duration of the stimulating input signal $U_E$, so that a virtually steady state exists at the output DQ for each measurement of the currents $I_1$ and $I_2$. The period duration of the signal $U_E$ can be changed, for example, by reprogramming the signal transmitter SG through the use of an external control signal BS from an operating mode controller.

FIG. 3 shows an exemplary embodiment of the circuit according to the invention, from which it can be seen that the inputs E of a plurality of pad cells PC to be tested are connected in parallel to a connection A for the periodic output signal from the signal transmitter SG. A variant is also conceivable in which, if there are a plurality of outputs A from the signal transmitter SG, each individual output is connected in parallel to a respective one of the inputs E of the pad cell PC.

A multiplexer circuit MUX is provided in order to switch over between a test mode for functional testing of the pad cells PC as a first operating mode of the integrated circuit, and a normal mode as a second operating mode of the integrated circuit. A respective multiplexer circuit MUX is connected between the output A of the signal transmitter SG and each connection E for the input signal of the pad cells PC and is also controlled, for example, by the signal BS from an operating mode controller. In addition to one input to which the output signal from the signal transmitter SG is applied, another input of the multiplexer circuit MUX is provided in each case for a signal 0 to n, which can be output in the normal mode to another functional unit FE in the integrated circuit.

FIG. 4 shows a further exemplary embodiment of the circuit according to the invention. In this case, the connections E for the input signals of a plurality of pad cells PC to be tested are each connected in series through a respective clock-controlled shift register cell FF0 to FFn to a connection A for the output signal from the signal transmitter SG. Consequently, the periodic output signal from the signal transmitter SG is applied to each pad cell PC, in each case delayed by one clock period of the shift register cells FF0 to FFn. This exemplary embodiment is advantageous for circuits in which the pad cells PC are already connected to one another through shift register cells FF0 to FFn for other purposes (for example for printed circuit boards with "boundary scan").

The shift register cells FF0 to FFn and the signal transmitter SG can be provided, for example, through the use of clock-controlled bistable multivibrators. The signal transmitter SG may, for example, be a T-flip-flop with a hardwired input, and the shift register cells FF0 to FFn may be provided, for example, by D-flip-flops. The signal transmitter SG and the shift register cells FF0 to FFn are controlled by the same clock for this purpose. The T-flip-flops, as described above, are advantageously constructed in such a way that the respective periodic output signals can be varied by reprogramming.

I claim:

1. An integrated semiconductor circuit, comprising:
    a plurality of pad cells to be monitored in one operating mode by a functional test, said plurality of pad cells each having a connecting pad, an upstream output driver, and a connection for an input signal;
    a signal transmitter for producing periodic signal sequences, said signal transmitter having a connection for a periodic output signal connected to said connections for an input signal of said plurality of pad cells to be tested, in order to test a transmission response of said plurality of pad cells in said one operating mode; and
    shift register cells each connected in series between said connection for an input signal of a respective one of said plurality of pad cells and said connection of said signal transmitter for an output signal;
    said connections for an input signal of said plurality of pad cells being connected in parallel to said connection of said signal transmitter for an output signal.

2. The integrated semiconductor circuit according to claim 1, wherein said signal transmitter is reprogrammable to produce different periodic signal sequences.

3. The integrated semiconductor circuit according to claim 1, including multiplexer circuits each connected between said connection for an input signal of a respective one of said pad cells and said connection of said signal transmitter for an output signal, to switch over between said one operating mode and another operating mode.

4. The integrated semiconductor circuit according to claim 3, including:
    another functional unit having a connection for a signal;
    each of said multiplexer circuits having an output connected to said connection for an input signal of a respective one of said pad cells to be tested;
    each of said multiplexer circuits having one input connected to said connection of said signal transmitter for an output signal;
    each of said multiplexer circuits having another input to be connected to said connection for a signal of said other functional unit;
    the output signal from said signal transmitter being present at said output of said multiplexer circuits in said one operating mode; and
    the signal from said other functional unit being present at said output of said multiplexer circuits in said other operating mode.

5. A method for testing a transmission response of pad cells in an integrated semiconductor circuit according to claim 1, which comprises:
    connecting an output of a pad cell to be tested to a measurement input of a measurement configuration suitable for spectrum analysis; and
    measuring a transmission response of the pad cell in a frequency domain using the measurement configuration.

6. The method according to claim 5, which comprises measuring at least one of an amplitude response and a phase response of a recorded frequency spectrum.

7. A method for testing a transmission response of pad cells in an integrated semiconductor circuit according to claim 1, which comprises:
    connecting an output of a pad cell to be tested to a measurement input of a measurement configuration suitable for spectrum analysis; and
    measuring a transmission response of the pad cell by direct-current measurement at an output of the pad cell.

8. An integrated semiconductor circuit, comprising:
    a plurality of pad cells to be monitored in one operating mode by a functional test, said plurality of pad cells each having a connecting pad, an upstream output driver, and a connection for an input signal;
    a signal transmitter for producing periodic signal sequences, said signal transmitter having a clock-controlled bistable multivibrator of the T-flip-flop type and a connection for a periodic output signal connected to said connection for an input signal of said plurality of pad cells to be tested, in order to test a transmission response of said plurality of pad cells in said one operating mode; and
    shift register cells each connected in series between said connection for an input signal of a respective one of said plurality of pad cells and said connection of said signal transmitter for an output signal.

* * * * *